US011966287B2

(12) United States Patent
Ayyapureddi

(10) Patent No.: US 11,966,287 B2
(45) Date of Patent: Apr. 23, 2024

(54) MULTIPLE BIT ERROR DETECTION IN SCRUB OPERATIONS

(71) Applicant: Micron Technology, Inc., Boise, ID (US)

(72) Inventor: Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/655,955

(22) Filed: Mar. 22, 2022

(65) Prior Publication Data

US 2023/0305921 A1 Sep. 28, 2023

(51) Int. Cl.
*G11C 29/00* (2006.01)
*G06F 11/07* (2006.01)
*G06F 11/10* (2006.01)

(52) U.S. Cl.
CPC ...... *G06F 11/1068* (2013.01); *G06F 11/0772* (2013.01); *G06F 11/106* (2013.01)

(58) Field of Classification Search
CPC ............ G06F 11/1068; G06F 11/0772; G06F 11/106
See application file for complete search history.

(56) References Cited

U.S. PATENT DOCUMENTS

| | | | |
|---|---|---|---|
| 2005/0216063 A1* | 9/2005 | Hoyme | G06F 11/073 607/2 |
| 2010/0185897 A1* | 7/2010 | Abts | G11C 29/44 714/53 |
| 2019/0073261 A1* | 3/2019 | Halbert | G06F 3/0679 |

* cited by examiner

*Primary Examiner* — Samir W Rizk
(74) *Attorney, Agent, or Firm* — Holland & Hart LLP

(57) ABSTRACT

Methods, systems, and devices for multiple bit error detection in scrub operations are described. A memory device may initiate a scrub operation on a set of rows of the memory device and determine whether to perform the scrub operation using a first error control mode associated with correcting single-bit errors or using a second error control mode associated with correcting single-bit errors and detecting multiple-bit errors. In a case that the memory device determines to perform the scrub operation using the second error control mode, the memory device may read data and first error control information from the set of rows and additional second error control information for a different partition of the memory device storing error control information. The memory device may then correct single-bit errors and detect multiple-bit errors based on the data, first error control information, and second error control information as part of the scrub operation.

22 Claims, 6 Drawing Sheets

MULTIPLE BIT ERROR DETECTION IN SCRUB OPERATIONS

FIELD OF TECHNOLOGY

The following relates to one or more systems for memory, including multiple bit error detection in scrub operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
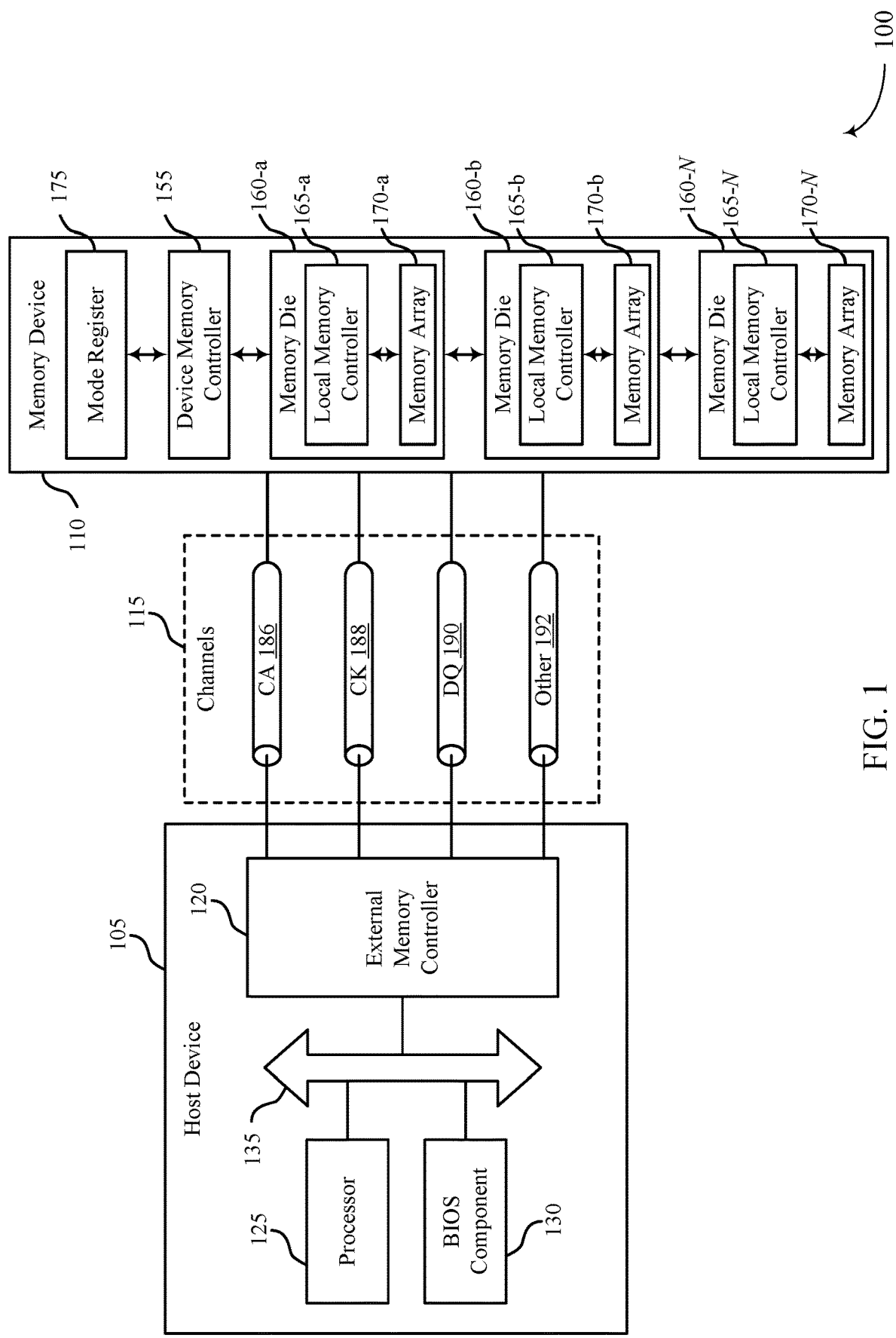
FIG. 1 illustrates an example of a system that supports multiple bit error detection in scrub operations in accordance with examples as disclosed herein.

A memory device may store data and error control information associated with the data at a memory array. Additionally, the memory device may be configured to scrub the memory array to detect or correct errors within data stored at the memory array. To perform a scrub operation, the memory device may generate internal commands to scrub each row of the memory array. Alternatively, the memory device may receive one or more scrub commands from a host device indicating for the memory device to perform the scrub operation. The scrub operation may include the memory device reading data and error control information from the rows of the memory array, performing a single-bit error control operation on the data using the error control information (e.g., to correct single-bit errors in the data), and, in some cases, writing corrected data back to the memory array. A single scrub operation may correspond to the memory device scrubbing each of the rows of the memory array.

In some instances, however, the memory device may be unable to detect multiple-bit errors in data when performing a scrub operation. For example, a memory device that employs an error control mode associated with a single error correction (SEC) scheme for a scrub may be unable to detect multiple-bit errors in data stored in the memory array during the scrub operation. Additionally, a memory device that employs the error control mode associated with the SEC scheme may introduce additional errors into data that includes one or more multiple-bit errors.

Systems, techniques, and devices are described herein for a memory device to use a first error control mode associated with correcting single-bit errors (e.g., using a SEC scheme) or a second error control mode associated with correcting single-bit errors and detecting multiple-bit errors (e.g., using a different scheme such as a single error correction double error detection (SECDED) scheme) when storing information (e.g., as part of a write operation) or when retrieving information (e.g., as part of a read operation or a scrub operation). Such configurability may enable a memory device to be configurable to provide additional error protection (e.g., using the second error control mode) in some cases. In response to a memory device initiating a scrub operation, the memory device may determine whether to perform the scrub operation using the first error control mode or the second error control mode (e.g., based on whether the data was written using the first error control mode or the second error control mode). In cases that the memory device determines to perform the scrub operation according to the second error control mode (e.g., to both correct single-bit errors and detect multiple-bit errors in the data), the memory device may read the data and first error control information from the rows of the memory array and read second error control information from another partition of the memory array. In some examples, the memory device may rely on the first error control information to correct single-bit errors and may rely on a combination of the first and second error control information to detect multiple-bit errors.

Additionally, the memory device may store an indication of multiple-bit errors detected in the data during the scrub operation. For example, the memory device may store indications of detected multiple-bit errors in the partition of the memory array storing the second error control information. In some cases, by performing a scrub operation using an error control mode that detects multiple-bit errors, the memory device may improve a reliability of data stored in the memory array as compared to performing a scrub operation using an error control mode that does not detect multiple-bit errors.

Features of the disclosure are initially described in the context of a system and die as described with reference to FIGS. 1 and 2. Features of the disclosure are described in the context of a system and process flow as described with reference to FIGS. 3 and 4. These and other features of the disclosure are further illustrated by and described with reference to an apparatus diagram and a flowchart that relate to multiple bit error detection in scrub operations as described with reference to FIGS. 5 and 6.

FIG. 1 illustrates an example of a system 100 that supports multiple bit error detection in scrub operations in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

Portions of the system 100 may be examples of the host device 105. The host device 105 may be an example of a processor (e.g., circuitry, processing circuitry, a processing component) within a device that uses memory to execute processes. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, a scrub command for a scrub operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135. The processor 125 may be operable to provide functionality (e.g., control functionality) for the system 100 or the host device 105. The BIOS component 130 may be a software component that includes a BIOS operated as firmware, which may initialize and run various hardware components of the system 100 or the host device 105.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more rows, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110.

The components of the host device 105 may exchange information with the memory device 110 using one or more channels 115. The channels 115 may be operable to support communications between the external memory controller 120 and the memory device 110. Each channel 115 may include one or more signal paths (e.g., a transmission medium, a conductor) between terminals associated with the components of the system 100. A signal path may be an example of a conductive path operable to carry a signal.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof.

Some memory devices 110 may be configured to internally detect and in some cases correct (e.g., repair) errors and thereby recover the data as stored before the data becomes corrupted (e.g., uncorrectable errors are in the data). Such error detection and correction may rely upon error control information including one or more error-correcting codes (ECCs) (e.g., block codes, convolutional codes, Hamming codes, low-density parity-check codes, turbo codes, polar codes), and related processes, operations, and techniques may be referred as error control processes, ECC processes, ECC operations, ECC techniques, or in some cases as simply ECC. Error control operations conducted internally within the memory device 110 on data stored previously at the memory device 110 may generally be referred to as internal or on-die error control (whether within a single-die memory device or a multi-die memory device). For example, in-line error control may refer to embedded error control information (e.g., by a host device 105) within data stored in the memory device 110 that is checked (e.g., or corrected) by the host device 105. That is, for in-line error control, the memory device 110 may be unaware of the error control information and may treat both data and error control information as data. In another example, extra error control information bits may accompany data in a DQ channel 190 for read or write operations, and may be used to detect or correct errors that occur in transmission of data between the memory device 110 and the host device 105. This type of error control may be known as link error control.

During the execution of a write command, a memory device 110 with error control information may perform an error control operation on data to be stored at a memory array 170 (e.g., received from a host device) to generate error control information corresponding to the data. The memory device 110 may store the data and the error control information at the memory array 170 as part of the write operation.

The memory device 110 may perform the error control operation according to a first error control mode associated with correcting single-bit errors (e.g., using a SEC scheme) or a second error control mode associated with correcting single-bit errors and detecting multiple-bit errors (e.g., using a different scheme such as a single error correction double error detection (SECDED) scheme). For example, in cases that the memory device 110 performs the error control operation on data to be stored at the memory array 170 according to the first error control mode, the memory device 110 may generate first error control information associated with correcting single-bit errors and store the error control information and the data in a row of the memory array 170.

Additionally, in cases that the memory device 110 performs the error control operation on the data to be stored at the memory array 170 according to the second error control mode, the memory device 110 may generate additional error control information (e.g., when compared to performing the error control operation according to the first error control mode). That is, the memory device 110 may generate the first error control information associated with correcting the single-bit errors in addition to second error control information associated with detecting multiple-bit errors. Here, the memory device 110 may store the data and the first error control information in a row of the memory array 170. Additionally, the memory device 110 may store the second error control information in another partition of the memory array 170. For example, the memory array 170 may include a partition for storing data associated with columns of the memory array 170 (e.g., column metadata). Here, the memory array 170 may store the second error control information in the partition of the memory array 170 storing the column metadata.

In some cases, the memory device 110 or the external memory controller 120 may set the mode register 175 to a value indicating one of the error control modes corresponding to the data. For example, the memory device 110 or the external memory controller 120 may set the mode register 175 to a first value in cases that the memory device 110 performs the error control operation on the data to be stored at the memory array 170 according to the first error control mode. Additionally, the memory device 110 or the external memory controller 120 may set the mode register 175 to a second value (e.g., different than the first value) in case that the memory device 110 performs the error control operation on the data to be stored at the memory array 170 according to the second error control mode.

In some examples, the memory device 110 may store indications of either the first or second error control modes associated with data stored in each memory array 170. That is, the memory device 110 may set the mode register 175 to a value indicating whether the data stored in the memory array 170-a is associated with the first or second error control modes, whether the data stored in the second memory array 170-b is associated with the first or second error control modes, and whether the data stored in the memory array 170-N is associated with the first or second error control modes. Here, the memory device 110 may perform an error control operation on the data stored in a memory array 170 using a same error control mode to generate the error control information. In some other examples, the memory device 110 may store indications of either the first or second error control modes associated with data stored in each bank of a memory array 170. That is, the memory device 110 or the external memory controller 120 may set the mode register 175 to a value indicating whether the data stored in each bank of each of the memory arrays 170 is associated with the first or second error control modes. Here, the memory device 110 may perform an error control operation on the data stored in a bank of a memory array 170 using a same error control mode to generate the error control information.

The memory device 110 may be configured to scrub the memory arrays 170 to detect or correct errors within data stored at the memory arrays 170. To perform a scrub operation, the memory device 110 (e.g., the device memory controller 155, a local memory controller 165) may generate internal commands to scrub each row of the memory array 170. Alternatively, the memory device 110 may receive one or more scrub commands from the host device 105 indicating for the memory device 110 to perform the scrub operation. The scrub operation may include the memory device 110 reading the data and the error control information (e.g., stored in a memory array 170 during a write operation), performing the error control operation on the data (e.g., to detect errors within the data, to generate corrected data), and, in some cases, writing corrected data back to the memory array 170. A single scrub operation may correspond to the memory device 110 scrubbing each of the rows of the memory array 170.

In response to the memory device 110 initiating a scrub operation (e.g., in response to an internal command, in response to a command received from the host device 105), the memory device 110 may determine whether to perform the scrub operation using the first error control mode or the second error control mode. For example, the memory device 110 may read the mode register 175 to determine whether the memory device 110 generated error control information associated with the data in the memory array 170 (e.g., to be scrubbed during the scrub operation) by performing an error control operation according to the first error control mode or the second error control mode. In cases that the memory device 110 determines to perform the scrub operation according to the second error control mode (e.g., to both correct single-bit errors and detect multiple-bit errors in the data), the memory device 110 may read the data and first error control information from the rows of the memory array 170 and read second error control information from another partition of the memory array 170 (e.g., a partition of the memory array 170 storing column metadata). In some examples, the memory device 110 may rely on the first error control information to correct single-bit errors and may rely on a combination of the first and second error control information to detect multiple-bit errors. Additionally, the memory device 110 may store an indication of multiple-bit errors detected in the data during the scrub operation. For example, the memory device 110 may store indications of detected multiple-bit errors in the partition of the memory array 170 storing the second error control information. In some cases, by performing a scrub operation using an error control mode that detects multiple-bit errors, the memory device 110 may improve a reliability of data stored in the memory array 170 as compared to performing a scrub operation using an error control mode that does not detect multiple-bit errors.

Figure 2:
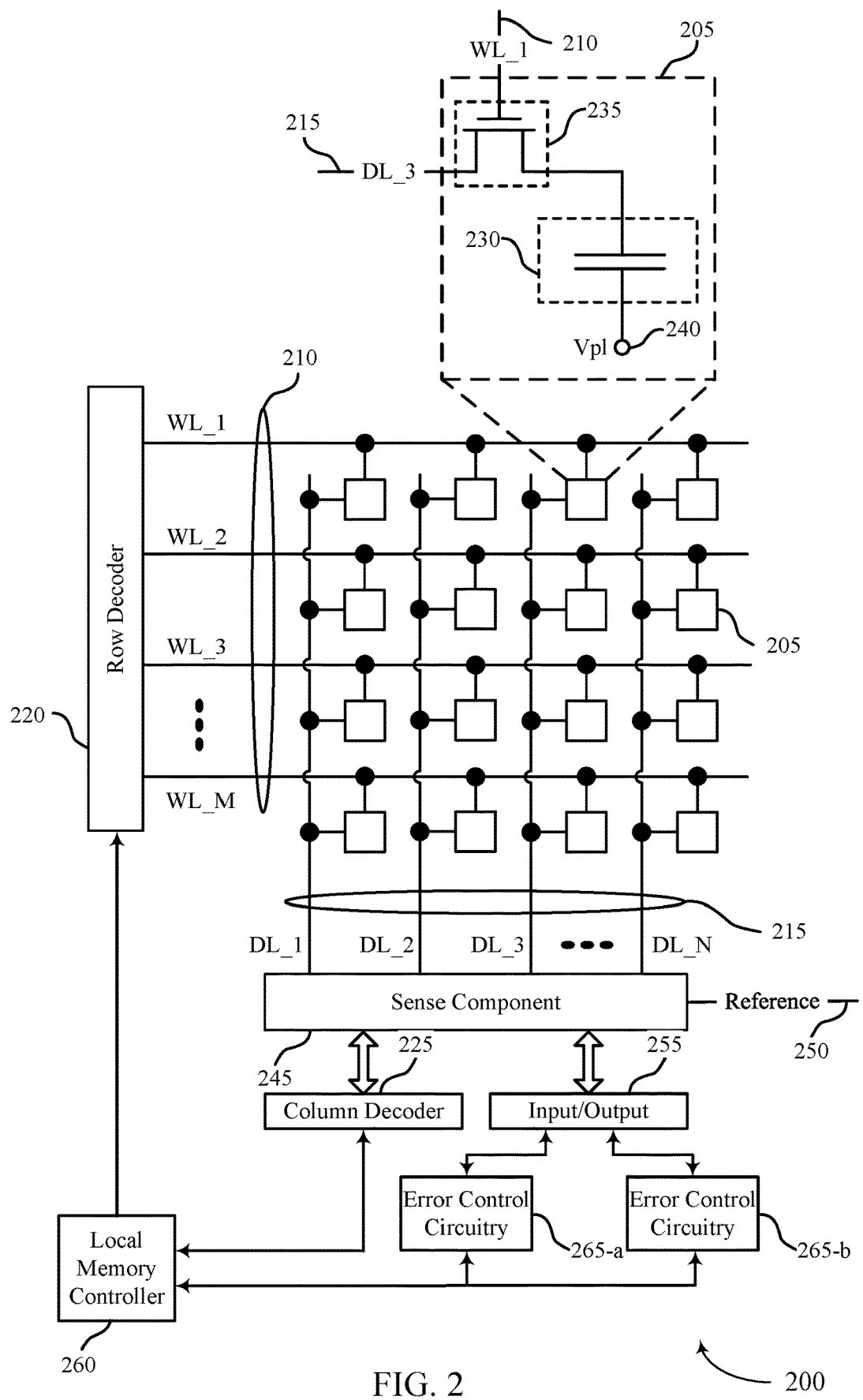
FIG. 2 illustrates an example of a memory die that supports multiple bit error detection in scrub operations in accordance with examples as disclosed herein.

FIG. 2 illustrates an example of a memory die 200 that supports multiple bit error detection in scrub operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. In some other examples, the memory cell 205 may include a logic storage component, such as capacitor 230, and a switching component 235 (e.g., a cell selection component). A node of the capacitor 230 may be coupled with a voltage source 240.

The memory die 200 may include access lines (e.g., word lines 210 and digit lines 215) arranged in a pattern, such as a grid-like pattern. Memory cells 205 may be positioned at intersections of the word lines 210 and the digit lines 215. Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address. Selecting or deselecting the memory cell 205 may be accomplished by activating or deactivating the switching component 235 using a word line 210. The capacitor 230 may be coupled with the digit line 215 using the switching component 235.

The sense component 245 may be operable to detect a state (e.g., a charge) stored on the capacitor 230 of the memory cell 205 and determine a logic state of the memory cell 205 based on the stored state. The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200.

The local memory controller 260 may be operable to perform one or more access operations on one or more memory cells 205 of the memory die 200. In some examples, access operations may be performed by or otherwise coordinated by the local memory controller 260 in response to various access commands (e.g., from a host device 105). T The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

The error control circuitry 265 may perform one or more error control operations on data. That is, the error control circuitry 265 may include error detection logic or may cause error detection logic (not shown) to perform the error detection operations described herein. In some cases, the error control circuitry 265-a may perform error control operations according to a first error control mode associated with correcting single-bit errors. For example, the error control circuitry 265-a may be configured to perform error control operations according to a SEC scheme. Additionally, the error control circuitry 265-b may perform error control operations according to a second error control mode associated with correcting single-bit errors and detecting multiple-bit errors. For example, the error control circuitry 265-b may be configured to perform error control operations according to a SECDED scheme.

The error control circuitry 265 may perform one or more error control operations on data received from the host device as part of a write operation. For example, the error control circuitry 265 may receive data from the host device as part of a write operation. The error control circuitry 265 may determine or generate error control information associated with the data. The error control circuitry 265 may cause the data and the error control information to be stored in one or more memory cells 205 as part of the write operation.

In some cases, the local memory controller 260 may communicate the data from the host device to the error control circuitry 265-a. Here, the error control circuitry 265-a may perform an error control operation on the data to generate error control information associated with correcting single-bit errors in the data. Then, the error control circuitry 265-a may cause the data and the error control information to be stored in a row of memory cells 205 as part of the write operation. Additionally, in cases that the local memory controller 260 communicates the data from the host device to the error control circuitry 265-b, the error control circuitry 265-b may perform an error control operation on the data to generate first error control information and the second error control information associated with the data. In some cases, the error control circuitry 265-a may be used to perform error control operations according to the first error control mode and the error control circuitry 265-b may be used to perform error control operations according to the second error control mode. In such examples, the second error control circuitry 265-a may be configured to generate and use both the first error control information and the second error control information, as both are associated with the second error control mode. Then, the error control circuitry 265-b may cause the data and the first error control information to be stored in a row of memory cells 205 as part of the write operation. Additionally, the error control circuitry 265-b may cause the second error control information to be stored in another partition of the memory die 200 associated with storing data corresponding to columns of the memory die 200 (e.g., column metadata).

In another example, the error control circuitry 265 may receive data and associated error control information from the memory die 200 as part of a read operation. The error control circuitry 265 may perform an error control operation based on the data and the error control information. In some instances, the error control circuitry 265-a may perform the error control operations on data as part of read operations (e.g., even in cases that the error control circuitry 265-b performed an error control operation based on the data during the write operation). In some other instances, a same error control circuitry 265 associated with receiving data and generating the error control information as part of a write operation may receive the data and error control information as part of the read operation. For example, for data stored in the memory die 200 based on the error control circuitry 265-a generating error control information associated with correcting single-bit errors, the error control circuitry 265-a may receive the data and the error control information from the memory die 200 as part of the read operation. Additionally, for data stored in at the memory die 200 based on the error control circuitry 265-b generating error control information associated with correcting single-bit errors and detecting multiple-bit errors, the error control circuitry 265-b may receive the data and the error control information (e.g., the first error control information stored in the row with the data and the second error control information stored in the other partition of the memory die 200 on the same row) as part of the read operation.

The local memory controller 260 may be configured to scrub the memory die 200 in order to detect or correct errors at one or more of the memory cells 205. To perform a scrub operation, the local memory controller 260 may generate internal commands (e.g., and addresses indicating one or more rows of the memory die 200) to scrub each row of the memory die 200. Alternatively, the local memory controller 260 may receive one or more scrub commands from a host device (e.g., an external memory controller is discussed with reference to FIG. 1) associated with the scrub operation. The scrub operation may include the local memory controller 260 initiating a read operation to read data and error control information stored in a row of the memory die 200. Then, the error control circuitry 265 may perform an error control operation on the data based on the error control information (e.g., to detect errors within the data, to generate corrected data). Then, in some cases, the scrub operation may additionally include the local memory controller 260 writing the corrected data back to the memory cells of the memory die 200. A single scrub operation may correspond to the local memory controller 260 scrubbing each of the rows of the memory die 200. The scrub operation may increase the reliability of the memory die 200 by correcting bit errors before they build up to a level that may not be able to be corrected by error control circuitry 265 based on the quantity of error control bits stored with the data in each row.

The scrub operation may include either the error control circuitry 265-a performing error control operations on the data or the error control circuitry 265-b performing error control operations. That is, the local memory controller 260 may determine whether to perform a scrub operation according to a first error control mode using the error control circuitry 265-*a* to correct single-bit errors in the data or according to a second error control mode using the error control circuitry 265-*b* to correct single-bit errors and detect multiple-bit errors in the data. For example, the local memory controller 260 may determine whether to perform the scrub operation according to the first or second error control mode based on a value stored in a mode register. In some cases, the scrub operation may rely on a same error control circuitry 265 that generated the error control information associated with the data (e.g., as part of a write operation).

In cases that the local memory controller 260 determines to perform the scrub operation according to the first error control mode using the error control circuitry 265-*a* (e.g., to correct single-bit errors), the error control circuitry 265-*a* may receive the data and the error control information stored in the rows of the memory die 200, perform an error control operation to correct single-bit errors, and write the data back to the rows of the memory die 200. In cases that the local memory controller 260 determines to perform the scrub operation according to the second error control mode using the error control circuitry 265-*b* (e.g., to both correct single-bit errors and detect multiple-bit errors in the data), the error control circuitry 265-*b* may receive the data and error control information from the rows of the memory die 200 and error control information from another partition of the memory die 200 (e.g., a partition of the memory die 200 storing column metadata). Then, the error control circuitry 265-*b* may perform an error control operation to correct single-bit errors and detect multiple-bit errors. The error control circuitry 265-*b* may then write the data back to the rows of the memory die 200 and may store an indication of the detected presence of multiple-bit errors (e.g., in the partition of the memory die 200 storing the column metadata).

Figure 3:
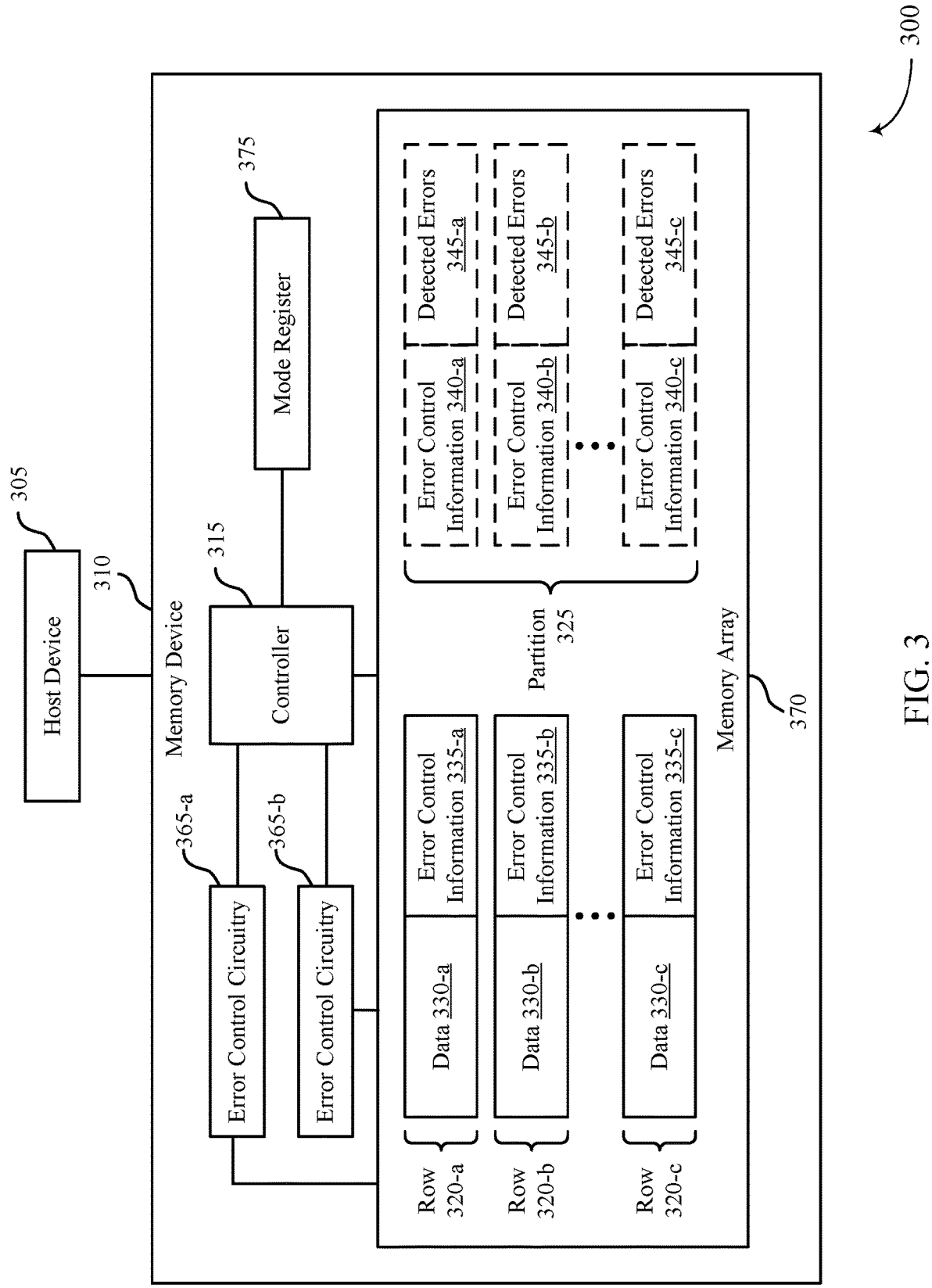
FIG. 3 illustrates an example of a system that supports multiple bit error detection in scrub operations in accordance with examples as disclosed herein.

FIG. 3 illustrates an example of a system 300 that supports multiple bit error detection in scrub operations in accordance with examples as disclosed herein. The system 300 may include one or more components described herein with reference to FIGS. 1 and 2, among others. For example, the system 300 may include a host device 305, which may be an example of the host device as described with reference to FIG. 1; a memory device 310, which may be an example of the memory device or memory die as described with reference to FIGS. 1 and 2; a controller 315, which may be an example of the device memory controller or a local memory controller as described with reference to FIGS. 1 and 2; a memory array 370, which may be an example of the memory arrays or memory dies as described with reference to FIGS. 1 and 2; error control circuitry 365 which may be an example of the local memory controllers or the error control circuitry as described with reference to FIGS. 1 and 2; and a mode register 375, which may be an example of the mode register as described with reference to FIG. 1.

The memory device 310 may include multiple error control circuitry 365. For example, the memory device 310 may include first error control circuitry 365-*a* and second error control circuitry 365-*b*. In some cases, the error control circuitry 365-*a* may perform error control operations according to a first error control mode associated with correcting single-bit errors. For example, the error control circuitry 365-*a* may be configured to perform error control operations according to a SEC scheme. Additionally, the error control circuitry 365-*b* may perform error control operations according to a second error control mode associated with correcting single-bit errors and detecting multiple-bit errors. For example, the error control circuitry 365-*b* may be configured to perform error control operations according to a SECDED scheme.

The memory array 370 may include a set of rows 320, where each row 320 may store data (e.g., including one or more codewords) and error control information 335 (e.g., associated with the data). In some cases, the error control information 335 may be associated with correcting single-bit errors in the data 330. Additionally, the memory array 370 may include a partition 325 storing data associated with one or more columns of the memory array 370 (e.g., column metadata). In some cases, the rows 320 may store user data (e.g., in response to write commands received from the host device 305). Additionally, the partition 325 may store data associated with the memory array 370 (e.g., metadata associated with columns of the memory array 370).

The host device 305 may send commands to memory device 310 including access commands to perform one or more access operations (e.g., a read operation, a write operation, a scrub operation) at the memory array 370. The controller 315 may process the commands and execute the commands on memory array 370. The error control circuitry 365 may perform one or more error detection or correction operations on data associated with the access commands.

During a write operation, the host device 305 may send, to the memory device 310, a write command including data 330 to be written to the memory array 370. The controller 315 may communicate the data 330 to either the error control circuitry 365-*a* or the error control circuitry 365-*b*, which may generate error control information 335 (and in some cases, error control information 340) based on the data 330 received from controller 315. The error control circuitry 365 may communicate the error control information 335 to the controller 315 to be stored at the memory array 370.

For example, the error control circuitry 365-*a* may perform an error control operation on the data 330 to generate error control information 335 associated with correcting single-bit errors in the data 330. Then, the error control circuitry 365-*a* may cause the data 330 and the error control information 335 to be stored in a row 320 of the memory array 370 as part of the write operation. Here, the partition 325 may not store error control information 340 associated with the data 330. That is, the error control circuitry 365 may not generate the error control information 340, thus the partition 325 may not store the error control information 340.

Additionally, the controller 315 may set the mode register 375 to a value indicating that the data 330 is associated with the first error control mode (e.g., an error control mode corresponding to the error control circuitry 365-*a* and associated with correcting single-bit errors). In some cases, the host device 305 may set the mode register 375 to the value indicating that the data 330 is associated with the first error control mode. For example, in cases that the error control circuitry 365-*a* performs an error control operation on the data 330-*a* to generate the error control information 335-*a*, the controller 315 may set the mode register 375 to a value indicating that the data 330-*a* is associated with the first error control mode. In some cases, to indicate that the data 330-*a* is associated with the first error control mode, the mode register 375 may be set to a value indicating a quantity bits of the error control information 340 are stored in the partition 325. Additionally or alternatively, the mode register 375 may correspond to a first register set to a value indicating an error control mode associated with the data 330 (e.g., the first error control mode or the second error control mode). Additionally, the mode register 375 may correspond to a second register set to a value indicating the quantity of bits of the error control information 340 stored in the partition 325. In cases where the error control circuitry 365-a generates the error control information 335 (e.g., and does not generate any bits of error control information 340), the mode register 375 may indicate that no bits of error control information 340 are stored in the partition 325.

Additionally or alternatively, the error control circuitry 365-b may perform an error control operation on the data 330 to generate error control information 335 associated with correcting single-bit errors in the data 330 and error control information 340 associated (e.g., when used in combination with the error control information 335) with detecting multiple-bit errors in the data 330. Then, the error control circuitry 365-b may cause the data 330 and the error control information 335 to be stored in a row 320 of the memory array 370 as part of the write operation. Additionally, the error control circuitry 365-b may cause the error control information 340 to be stored in another partition 325 of the memory array 370 (e.g., associated with storing the error control information 340, associated with storing data corresponding to columns of the memory array 370).

Additionally, the controller 315 may set the mode register 375 to a value indicating that the data 330 is associated with the second error control mode (e.g., an error control mode corresponding to the error control circuitry 365-b and associated with correcting single-bit errors and detecting multiple-bit errors). In some cases, the host device 305 may set the mode register 375 to the value indicating that the data 330 is associated with the second error control mode. For example, in cases that the error control circuitry 365-b performs an error control operation on the data 330-b to generate the error control information 335-b and the error control information 340-b, the controller 315 may set the mode register 375 to a value indicating that the data 330-b is associated with the second error control mode. In some cases, the controller may set the mode register 375 to a value indicating a quantity bits of the error control information 340 are stored in the partition 325. Additionally or alternatively, the mode register 375 may correspond to a first register set to a value indicating an error control mode associated with the data (e.g., the first error control mode or the second error control mode. Additionally, the mode register 375 may correspond to a second register set to a value indicating the quantity of bits of the error control information 340 stored in the partition 325. In cases where the error control circuitry 365-b generates the error control information 335 and the error control information 340, the mode register 375 may indicate that the quantity of bits of error control information 340 that are stored in the partition 325 (e.g., one bit, two bits, more than two bits).

In some cases, the error control circuitry 365-b generating more error control information than the error control circuitry 365-a may enable the error control circuitry 365-b to detect more errors in the data 330 as compared to the error control circuitry 365-a. That is, additional bits of error control information may increase a quantity of errors within the data 330 that the error control circuitry 365 may detect. Table 1, shown below, illustrates an example comparison of quantities of detected errors (e.g., in comparison to quantities of total errors) based on error control operations using different quantities of error control information.

TABLE 1

| Error Control Information Bits | Percentage of Total Errors Detected |
|---|---|
| 8 | 46.4844% |
| 9 | 73.0469% |
| 10 | 86.4258% |
| 11 | 93.1641% |
| 12 | 96.5576% |
| 13 | 98.2666% |
| 14 | 99.1272% |
| 15 | 99.5605% |
| 16 | 99.7787% |

In the example of Table 1, the error control circuitry 365-a may generate 8 bits of error control information 335 while the error control circuitry 365-b may generate the 8 bits of error control information 335 and one or more additional bits of error control information 340. Here, the error control circuitry 365-a may rely on the 8 bits of error control information 335 to detect (e.g., correct) 46.4844% of errors in the data 330 stored in the memory array 370 while the error control circuitry 365-b may rely on the 9 or more bits of error control information 335 and 340 to detect more errors in the data 330.

The memory device 310 may be configured to scrub the memory array 370 in order to detect or correct errors within data 330 stored at the memory array 370. For example, controller 315 may initiate a scrub operation (e.g., based on internally-generated commands, based on a command received from the host device 305). Then, the controller 315 may determine whether to perform a scrub operation according to a first error control mode using the error control circuitry 365-a to correct single-bit errors in the data 330 or according to a second error control mode using the error control circuitry 365-b to correct single-bit errors and detect multiple-bit errors in the data 330.

The controller 315 may determine whether to perform the scrub operation according to the first or second error control mode based on a value stored in the mode register 375. In some cases, the mode register 375 may indicate the quantity of bits of the error control information 340 stored in the partition 325. That is, to indicate to perform the scrub operation according to the first error control mode, the mode register 375 may indicate no bits of error control information 340 stored in the partition 325. Additionally, to indicate to perform the scrub operation according to the second error control mode, the mode register 375 may indicate one or more bits of error control information 340 stored in the partition. In some cases, the controller 315 may determine (e.g., based on a value stored by the mode register 375) to perform the scrub operation using a same error control circuitry 365 that generated the error control information 335 and/or 340 associated with the data 330 (e.g., as part of a write operation).

In cases that the controller 315 determines to perform the scrub operation according to the first error control mode using the error control circuitry 365-a (e.g., to correct single-bit errors), the error control circuitry 365-a may receive the data 330 and the error control information 335 stored in the row 320, perform an error control operation to correct single-bit errors, and write the data 330 back to the rows 320. That is, the controller 315 may perform one read operation on the rows 320 (e.g., to read the data 330 and the error control information 335) for the error control circuitry 365-a to receive the data 330 and the error control information 335. To perform the error control operation, the error control circuitry 365-a may generate error control information based on the received data 330 and compare the received error control information 335 with the generated error control information. In the event that the received error control information and the generated error control information do not match, the error control circuitry 365 may detect and subsequently correct a single-bit error. Then, the controller 315 may perform a single write operation to store the corrected data 330 in the rows 320.

In cases that the controller 315 determines to perform the scrub operation according to the second error control mode using the error control circuitry 365-b (e.g., to both correct single-bit errors and detect multiple-bit errors in the data), the error control circuitry 365-b may receive the data 330, the error control information 335 from the rows 320, and the error control information 340 from the other partition 325 (e.g., a partition 325 storing column metadata). That is, the controller 315 may perform a first read operation on the rows 320 (e.g., to read the data 330 and the error control information 335) and a second read operation on the partition 325 (e.g., to read the error control information 340) for the error control circuitry 365-b to receive the data 330, the error control information 335, and the error control information 340. In some cases, the controller 315 may determine the quantity of bits of the error control information 340 to read from the partition 325 based on a value of the mode register 375. That is, the mode register 375 may indicate a summation of the quantity of bits of the error control information 340 (e.g., the summation of the quantity of bits in error control information 340-a, error control information 340-b, and error control information 340-c). Additionally or alternatively, the mode register 375 may indicate a quantity of bits in one error control information 340.

Then, the error control circuitry 365-b may perform an error control operation to correct single-bit errors and detect multiple-bit errors in the data 330. To perform the error control operation, the error control circuitry 365-b may generate error control information based on the received data 330 and compare the received error control information 335 and 340 with the generated error control information. In the event that the received error control information 335 and 340 and the generated error control information do not match, the error control circuitry 365 may detect single-bit and multiple-bit errors and, in some cases (e.g., in cases of single-bit errors) correct errors. The controller 315 may then perform one write operation to store the data 330 in the rows 320. Additionally, the controller 315 may perform another write operation to store an indication 345 of a presence of detected multiple-bit errors (e.g., in the partition 325). In some cases, the indication 345 may be stored in a register at the controller 315.

Figure 4:
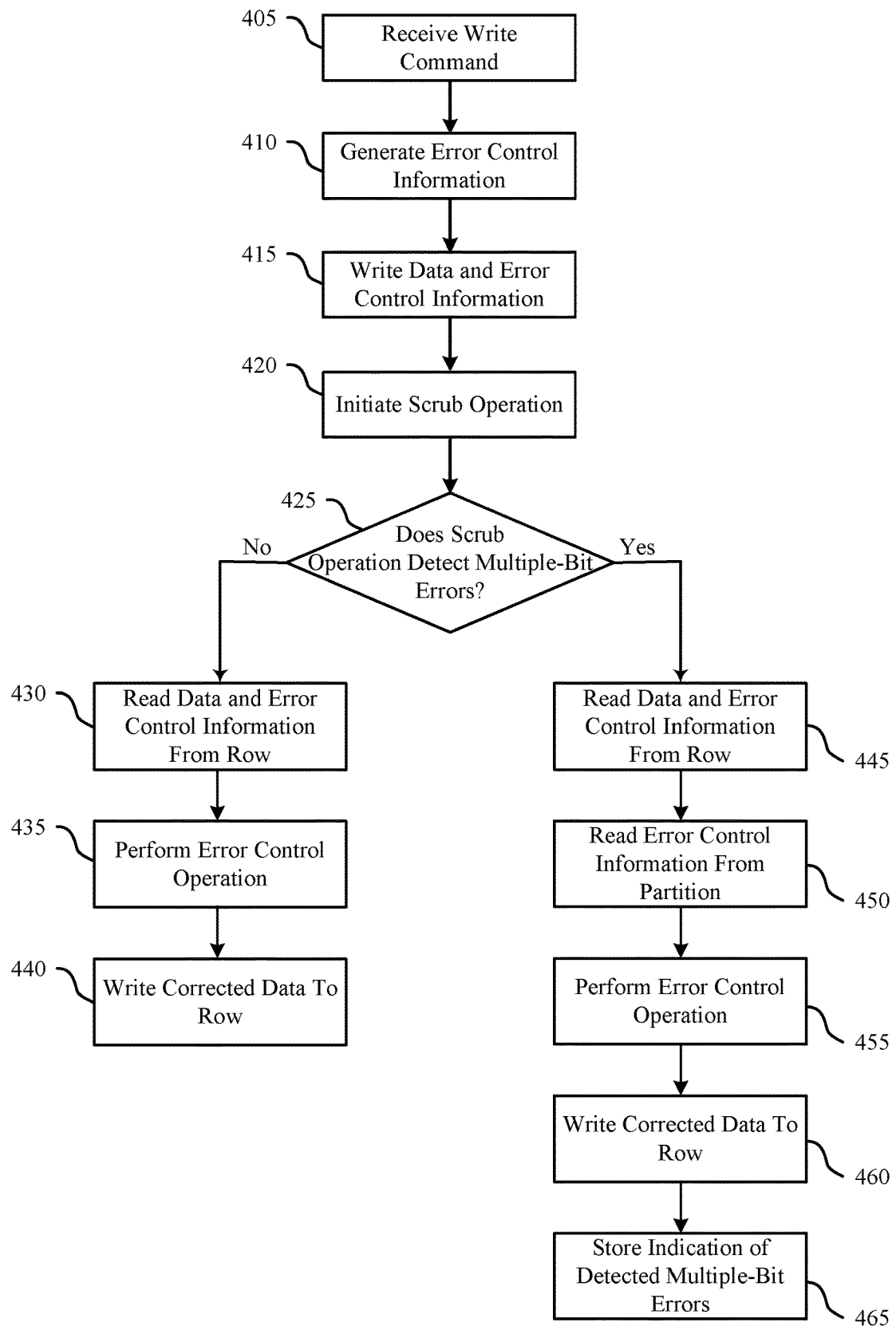
FIG. 4 illustrates an example of a process flow that supports multiple bit error detection in scrub operations in accordance with examples as disclosed herein.

FIG. 4 illustrates an example of a process flow 400 that supports multiple bit error detection in scrub operations in accordance with examples as disclosed herein. The process flow 400 may implement aspects of the systems 100 and 300 and memory die 200 described with reference to FIGS. 1 through 3. The process flow 400 may include operations performed by a memory device, which may be an example of the memory device, memory array, or memory die as described herein.

At 405, the memory device may receive a write command. At 410, the memory device may generate error control information based on the data included in the write command. In some cases, the memory device may generate the error control information based on performing an error control operation according to a first error control mode (e.g., to correct single-bit errors) or performing an error control operation according to a second error control mode (e.g., to correct single-bit errors and detect multiple-bit errors). In some cases, the memory device may generate more bits of error control information when performing the error control operation according to the second error control mode (e.g., as compared to a quantity of bits of error control information generated when performing the error control operation according to the first error control mode). The memory device may additionally set a mode register at the memory device to a value indicating which error control mode the data is associated with.

At 415, the memory device may write the data and error control information to a memory array. In cases that the memory device generates the error control information according to the first error control mode (e.g., associated with correcting single-bit errors), the memory device may store the data and error control information in rows of the memory array. Additionally, in cases that the memory device generates the error control information according to the second error control mode (e.g., associated with correcting single-bit errors and detecting multiple-bit errors), the memory device may store the data and a first portion of the error control information in the rows of the memory array and a second portion of the error control information in another partition of the memory array (e.g., that stores error control information such as column metadata).

At 420, the memory device may initiate a scrub operation. In one example, the memory device 420 may initiate the scrub operation in response to receiving a command from a host device. In another example, the memory device may generate internal commands to perform the scrub operation at the memory array. That is, the memory device may be configured to perform scrub operations of the memory array according to a periodicity (e.g., once a day, once a week, once an hour, or other periodicity). In some cases, the scrub operation may be initiated when the memory device is in idle state or is otherwise performing a reduced quantity of operations received from a host device.

At 425, the memory device may determine whether to perform the scrub operation according to the first error control mode (e.g., for correcting single-bit errors) or the second error control mode (e.g., for correcting single-bit errors and detecting multiple-bit errors). For example, the memory device may read the mode register to determine the error control mode for the scrub operation. In some cases, the mode register may indicate a quantity of bits of error control information stored in the partition of the memory array (e.g., instead of in rows of the memory array with the data). Here, the memory device may determine to perform the scrub operation according to the first error control mode in cases that the mode register indicates no bits of the error control information are stored in another partition of the memory array. Additionally, the memory device may determine to perform the scrub operation according to the second error control mode in cases that the mode register indicates that one or more bits of the error control information are stored in the partition of the memory array. In cases that the memory device determines to perform the scrub operation according to the first error control mode (e.g., to correct single-bit errors), the memory device may proceed to 430. Additionally, in cases that the memory device determines to perform the scrub operation according to the second error control mode (e.g., to correct single-bit errors and to detect multiple-bit errors), the memory device may proceed to 445.

At 430, the memory device may read, as part of the scrub operation initiated at 425, data and error control information stored in the rows of the memory array. For example, the memory device may read a set of codewords stored in the rows of the memory array and error control information associated with each of the set of codewords.

At 435, the memory device may perform an error control operation on the data stored in the row based on the error control information associated with the data. That is, the memory device may generate error control information based on the data stored in the rows of the memory array and compare the generated error control information with the error control information stored in the memory array. In some cases, as part of the error control operation, the memory device may additionally correct one or more single-bit errors in the data. That is, the memory device may generate corrected data based on the data and the error control information as part of the error control operation.

At 440, the memory device may write corrected data back to the rows of the memory array. In some cases, the memory device may complete an execution of the scrub operation on the memory array based on writing the corrected data back to the rows of the memory array.

At 445 (e.g., in cases that the memory device determines to perform the scrub operation according to the second error control mode), the memory device may read, as part of the scrub operation initiated at 425, data and error control information stored in the rows of the memory array. For example, the memory device may read a set of codewords stored in the rows of the memory array and error control information associated with each of the set of codewords.

At 450, the memory device may read, from another partition of the memory array (e.g., different from a partition of the memory array storing the data and error control information in the rows), additional error control information associated with the data. For example, the memory device may read the additional error control information from a partition of the memory array storing data corresponding to columns of the memory array (e.g., column metadata including error control information).

At 455, the memory device may perform an error control operation on the data stored in the row based on the error control information associated with the data. That is, the memory device may generate error control information based on the data stored in the rows of the memory array and compare the generated error control information with the error control information stored in the rows of the memory array and the additional error control information stored in the other partition of the memory array. The memory device may detect single-bit errors, multiple-bit errors, or both in the data based on performing the error control operation. In some cases, as part of the error control operation, the memory device may additionally correct one or more single-bit errors in the data. That is, the memory device may generate corrected data based on the data and the error control information as part of the error control operation.

At 460, the memory device may write corrected data back to the rows of the memory array. Additionally, at 465 the memory device may store an indication of a presence of multiple-bit errors detected in the data during the scrub operation. For example, the memory device may store the indication of the multiple-bit errors detected in the data in the partition of the memory array storing data associated with columns of the memory array (e.g., a same partition of the memory array storing the additional error control information). In some cases, the memory device may complete an execution of the scrub operation on the memory array based on writing the corrected data back to the memory array and storing the indication of the presence quantity of multiple-bit errors.

Figure 5:
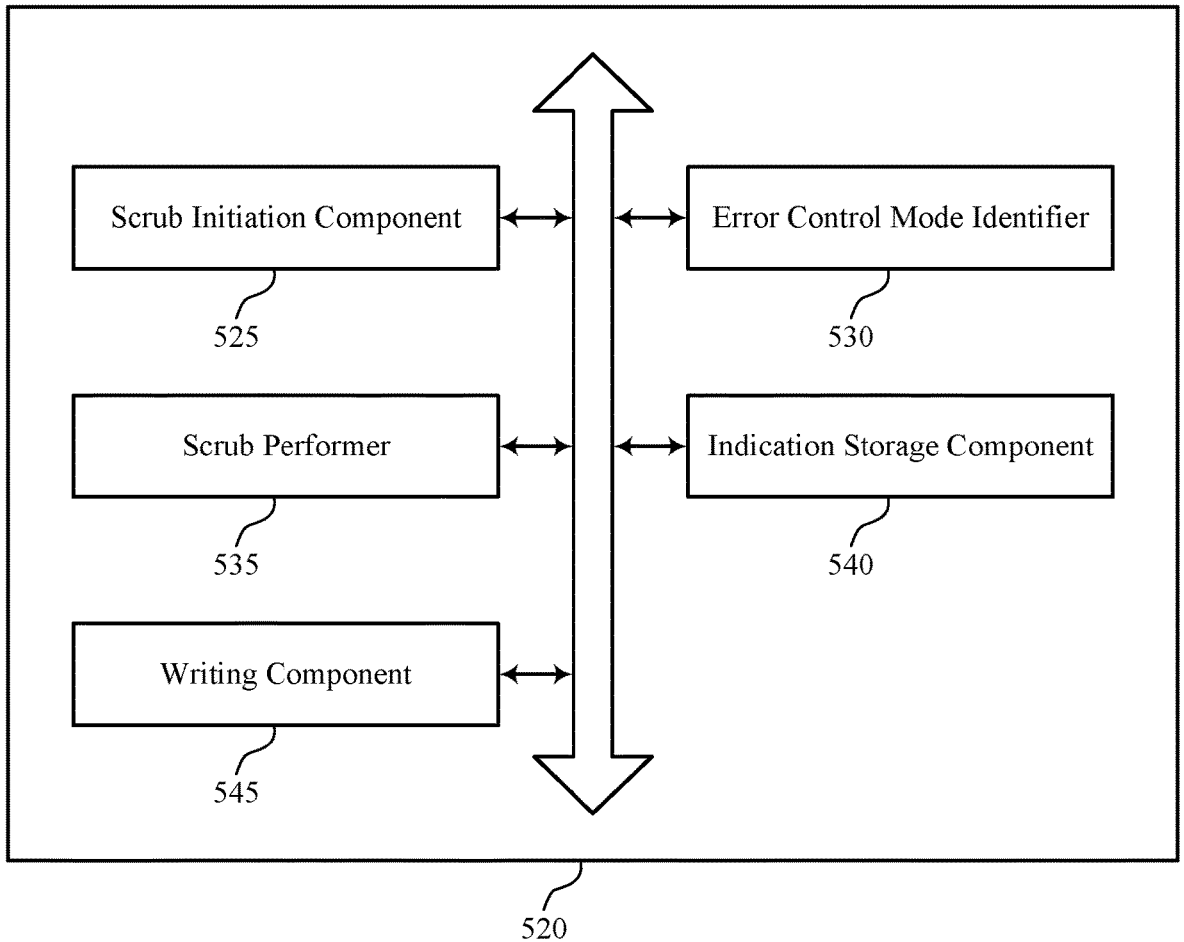
FIG. 5 shows a block diagram of a memory device that supports multiple bit error detection in scrub operations in accordance with examples as disclosed herein.

FIG. 5 shows a block diagram 500 of a memory device 520 that supports multiple bit error detection in scrub operations in accordance with examples as disclosed herein. The memory device 520 may be an example of aspects of a memory device as described with reference to FIGS. 1 through 4. The memory device 520, or various components thereof, may be an example of means for performing various aspects of multiple bit error detection in scrub operations as described herein. For example, the memory device 520 may include a scrub initiation component 525, an error control mode identifier 530, a scrub performer 535, an indication storage component 540, a writing component 545, or any combination thereof. Each of these components may communicate, directly or indirectly, with one another (e.g., via one or more buses).

The scrub initiation component 525 may be configured as or otherwise support a means for initiating, at a memory device, a scrub operation on a plurality of rows of the memory device. The error control mode identifier 530 may be configured as or otherwise support a means for determining whether to perform the initiated scrub operation using a first error control mode associated with correcting single-bit errors or using a second error control mode associated with correcting single-bit errors and detecting multiple-bit errors. The scrub performer 535 may be configured as or otherwise support a means for performing the scrub operation based at least in part on determining to perform the scrub operation using the second error control mode, where performing the scrub operation includes comparing data stored in each row with error control information to correct single-bit errors and detect multiple-bit errors in the data of each row.

In some examples, to support performing the scrub operation, the scrub performer 535 may be configured as or otherwise support a means for reading data and a first quantity of bits of the error control information from each of the plurality of rows. In some examples, to support performing the scrub operation, the scrub performer 535 may be configured as or otherwise support a means for reading a second quantity of bits of the error control information from a partition of the memory device storing error control information, where the comparing is based at least in part on reading the first quantity of bits and the second quantity of bits of the error control information.

In some examples, the first quantity of bits of the error control information is associated with correcting single-bit errors. In some examples, a combination of the first quantity of bits of the error control information and the second quantity of bits of the error control information is associated with detecting multiple-bit errors.

In some examples, the error control mode identifier 530 may be configured as or otherwise support a means for reading a mode register indicating the second quantity of bits, where reading the second quantity of bits of the error control information is based at least the mode register indicating the second quantity of bits.

In some examples, the scrub performer 535 may be configured as or otherwise support a means for detecting one or more multiple-bit errors in the data stored in the plurality of rows based at least in part on the comparing. In some examples, the indication storage component 540 may be configured as or otherwise support a means for storing indications of the one or more detected multiple-bit errors (e.g., an indication of a presence of the one or more detected multiple-bit errors) in a partition of the memory device storing error control information.

In some examples, the writing component 545 may be configured as or otherwise support a means for receiving a command to write first data to the memory device. In some examples, the error control mode identifier 530 may be configured as or otherwise support a means for determining whether to write the first data using the first error control mode or using the second error control mode. In some examples, the writing component 545 may be configured as or otherwise support a means for writing the first data and a first quantity of bits of the error control information to a first row of the plurality of rows based at least in part on receiving the command. In some examples, the writing component 545 may be configured as or otherwise support a means for writing a second quantity of bits of the error control information to a partition of the memory device storing error control information based at least in part on determining to write the first data using the second error control mode, where determining to perform the scrub operation using the second error control mode is based at least in part on writing the second quantity of bits.

In some examples, the error control mode identifier 530 may be configured as or otherwise support a means for writing a mode register to indicate the second error control mode based at least in part on determining to write the first data using the second error control mode, where determining to perform the scrub operation using the second error control mode is based at least in part on the mode register indicating the second error control mode.

In some examples, to support determining whether to perform the scrub operation using the first error control mode or using the second error control mode, the error control mode identifier 530 may be configured as or otherwise support a means for reading a mode register indicating the second error control mode.

In some examples, the scrub initiation component 525 may be configured as or otherwise support a means for initiating, at the memory device, a second scrub operation on a plurality of second rows of the memory device. In some examples, the error control mode identifier 530 may be configured as or otherwise support a means for determining whether to perform the initiated second scrub operation using the first error control mode or using the second error control mode. In some examples, the scrub performer 535 may be configured as or otherwise support a means for performing the second scrub operation based at least in part on determining to perform the second scrub operation using the second error control mode, where performing the second scrub operation includes comparing second data stored in each row of the plurality of second rows with second error control information to correct single-bit errors in the second data of each row of the plurality of second rows.

In some examples, to support performing the scrub operation, the scrub performer 535 may be configured as or otherwise support a means for performing, based at least in part on the comparing, an error control operation on the data read from the plurality of rows to correct single-bit errors and generate second data. In some examples, to support performing the scrub operation, the scrub performer 535 may be configured as or otherwise support a means for writing the second data to the plurality of rows.

Figure 6:
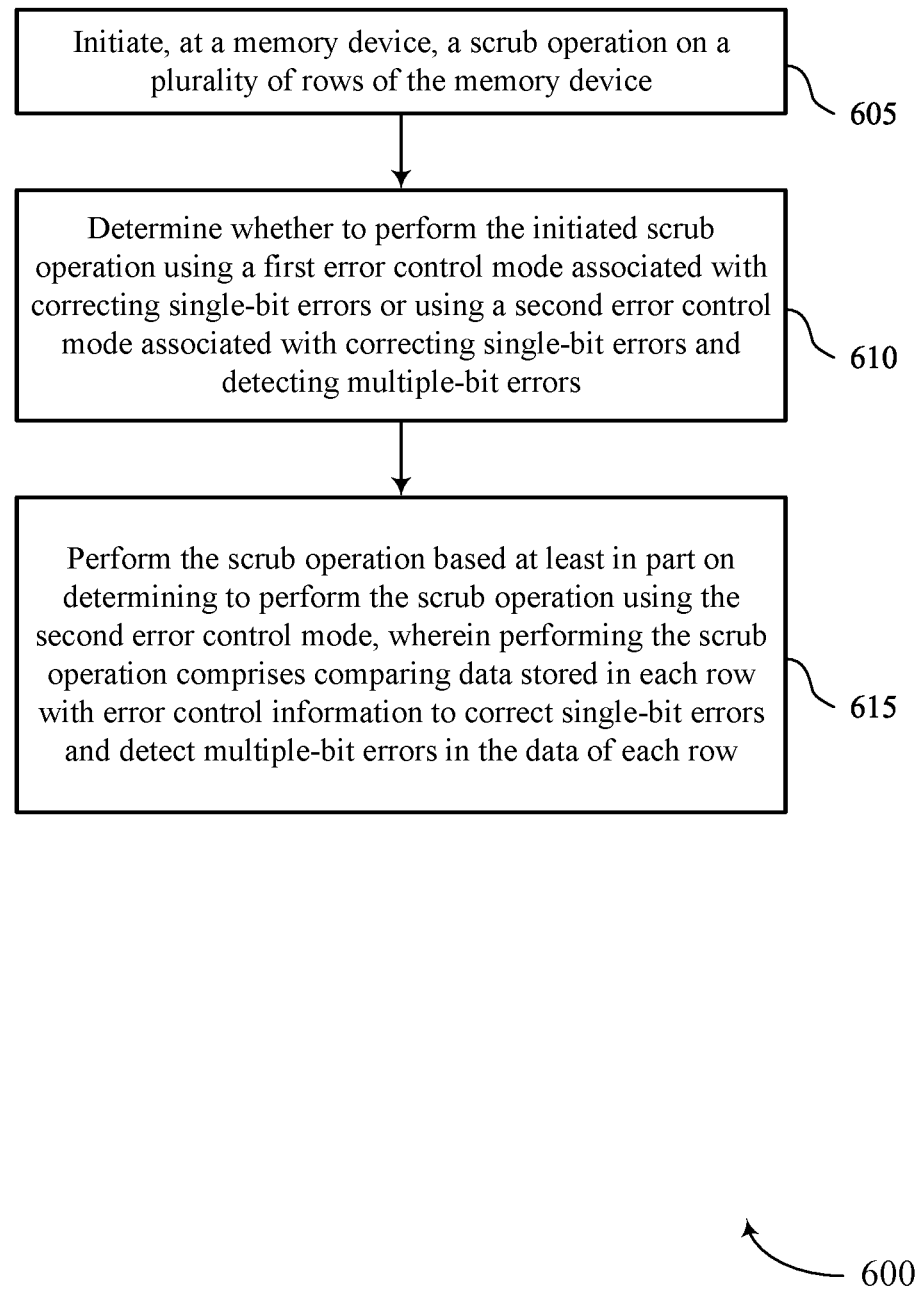
FIG. 6 shows a flowchart illustrating a method or methods that support multiple bit error detection in scrub operations in accordance with examples as disclosed herein.

FIG. 6 shows a flowchart illustrating a method 600 that supports multiple bit error detection in scrub operations in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include initiating, at a memory device, a scrub operation on a plurality of rows of the memory device. The operations of 605 may be performed in accordance with examples as disclosed herein. In some examples, aspects of the operations of 605 may be performed by a scrub initiation component 525 as described with reference to FIG. 5.

At 610, the method may include determining whether to perform the initiated scrub operation using a first error control mode associated with correcting single-bit errors or using a second error control mode associated with correcting single-bit errors and detecting multiple-bit errors. The operations of 610 may be performed in accordance with examples as disclosed herein. In some examples, aspects of the operations of 610 may be performed by an error control mode identifier 530 as described with reference to FIG. 5.

At 615, the method may include performing the scrub operation based at least in part on determining to perform the scrub operation using the second error control mode, where performing the scrub operation includes comparing data stored in each row with error control information to correct single-bit errors and detect multiple-bit errors in the data of each row. The operations of 615 may be performed in accordance with examples as disclosed herein. In some examples, aspects of the operations of 615 may be performed by a scrub performer 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for initiating, at a memory device, a scrub operation on a plurality of rows of the memory device; determining whether to perform the initiated scrub operation using a first error control mode associated with correcting single-bit errors or using a second error control mode associated with correcting single-bit errors and detecting multiple-bit errors; and performing the scrub operation based at least in part on determining to perform the scrub operation using the second error control mode, where performing the scrub operation includes comparing data stored in each row with error control information to correct single-bit errors and detect multiple-bit errors in the data of each row.

Aspect 2: The method, apparatus, or non-transitory computer-readable medium of aspect 1 where performing the scrub operation, further includes operations, features, circuitry, logic, means, or instructions, or any combination thereof for reading data and a first quantity of bits of the error control information from each of the plurality of rows and reading a second quantity of bits of the error control information from a partition of the memory device storing error control information, where the comparing is based at least in part on reading the first quantity of bits and the second quantity of bits of the error control information.

Aspect 3: The method, apparatus, or non-transitory computer-readable medium of aspect 2 where the first quantity of bits of the error control information is associated with correcting single-bit errors and a combination of the first quantity of bits of the error control information and the second quantity of bits of the error control information is associated with detecting multiple-bit errors.

Aspect 4: The method, apparatus, or non-transitory computer-readable medium of any of aspects 2 through 3, further including operations, features, circuitry, logic, means, or instructions, or any combination thereof for reading a mode register indicating the second quantity of bits, where reading the second quantity of bits of the error control information is based at least the mode register indicating the second quantity of bits.

Aspect 5: The method, apparatus, or non-transitory computer-readable medium of any of aspects 1 through 4, further including operations, features, circuitry, logic, means, or instructions, or any combination thereof for detecting one or more multiple-bit errors in the data stored in the plurality of rows based at least in part on the comparing and storing indications of the one or more detected multiple-bit errors in a partition of the memory device storing error control information.

Aspect 6: The method, apparatus, or non-transitory computer-readable medium of any of aspects 1 through 5, further including operations, features, circuitry, logic, means, or instructions, or any combination thereof for receiving a command to write first data to the memory device; determining whether to write the first data using the first error control mode or using the second error control mode; writing the first data and a first quantity of bits of the error control information to a first row of the plurality of rows based at least in part on receiving the command; and writing a second quantity of bits of the error control information to a partition of the memory device storing error control information based at least in part on determining to write the first data using the second error control mode, where determining to perform the scrub operation using the second error control mode is based at least in part on writing the second quantity of bits.

Aspect 7: The method, apparatus, or non-transitory computer-readable medium of aspect 6, further including operations, features, circuitry, logic, means, or instructions, or any combination thereof for writing a mode register to indicate the second error control mode based at least in part on determining to write the first data using the second error control mode, where determining to perform the scrub operation using the second error control mode is based at least in part on the mode register indicating the second error control mode.

Aspect 8: The method, apparatus, or non-transitory computer-readable medium of any of aspects 1 through 7 where determining whether to perform the scrub operation using the first error control mode or using the second error control mode includes operations, features, circuitry, logic, means, or instructions, or any combination thereof for reading a mode register indicating the second error control mode.

Aspect 9: The method, apparatus, or non-transitory computer-readable medium of any of aspects 1 through 8, further including operations, features, circuitry, logic, means, or instructions, or any combination thereof for initiating, at the memory device, a second scrub operation on a plurality of second rows of the memory device; determining whether to perform the initiated second scrub operation using the first error control mode or using the second error control mode; and performing the second scrub operation based at least in part on determining to perform the second scrub operation using the second error control mode, where performing the second scrub operation includes comparing second data stored in each row of the plurality of second rows with second error control information to correct single-bit errors in the second data of each row of the plurality of second rows.

Aspect 10: The method, apparatus, or non-transitory computer-readable medium of any of aspects 1 through 9 where performing the scrub operation, further includes operations, features, circuitry, logic, means, or instructions, or any combination thereof for performing, based at least in part on the comparing, an error control operation on the data read from the plurality of rows to correct single-bit errors and generate second data and writing the second data to the plurality of rows.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method by a memory device, comprising:
initiating, at the memory device, a scrub operation on a plurality of rows of the memory device;
determining whether to perform the initiated scrub operation using a first error control mode associated with correcting single-bit errors or using a second error control mode associated with correcting single-bit errors and detecting multiple-bit errors; and
performing the scrub operation based at least in part on determining to perform the scrub operation using the second error control mode, wherein performing the scrub operation comprises:
reading data and a first quantity of bits of error control information from each of the plurality of rows;
reading a second quantity of bits of the error control information from a partition of the memory device storing the error control information; and
comparing bits of second error control information associated with data stored in each row with the first quantity of bits and the second quantity of bits of the error control information for the row to correct single-bit errors and detect multiple-bit errors in the data of each row.

2. The method of claim 1, wherein:
the first quantity of bits of the error control information is associated with correcting single-bit errors; and
a combination of the first quantity of bits of the error control information and the second quantity of bits of the error control information is associated with detecting multiple-bit errors.

3. The method of claim 1, further comprising:
reading a mode register indicating the second quantity of bits, wherein reading the second quantity of bits of the error control information is based at least the mode register indicating the second quantity of bits.

4. The method of claim 1, further comprising:
detecting one or more multiple-bit errors in the data stored in the plurality of rows based at least in part on the comparing; and
storing indications of the one or more detected multiple-bit errors in the partition of the memory device storing the error control information.

5. The method of claim 1, further comprising:
receiving a command to write first data to the memory device;
determining whether to write the first data using the first error control mode or using the second error control mode;
writing the first data and a third quantity of bits of the error control information to a first row of the plurality of rows based at least in part on receiving the command; and
writing a fourth quantity of bits of the error control information to the partition of the memory device storing the error control information based at least in part on determining to write the first data using the second error control mode, wherein determining to perform the scrub operation using the second error control mode is based at least in part on writing the fourth quantity of bits.

6. The method of claim 5, further comprising:
writing a mode register to indicate the second error control mode based at least in part on determining to write the first data using the second error control mode, wherein determining to perform the scrub operation using the second error control mode is based at least in part on the mode register indicating the second error control mode.

7. The method of claim 1, wherein determining whether to perform the scrub operation using the first error control mode or using the second error control mode comprises:
reading a mode register indicating the second error control mode.

8. The method of claim 1, further comprising:
initiating, at the memory device, a second scrub operation on a plurality of second rows of the memory device;
determining whether to perform the initiated second scrub operation using the first error control mode or using the second error control mode; and
performing the second scrub operation based at least in part on determining to perform the second scrub operation using the second error control mode, wherein performing the second scrub operation comprises comparing second data stored in each row of the plurality of second rows with third error control information to correct single-bit errors in the second data of each row of the plurality of second rows.

9. The method of claim 1, wherein performing the scrub operation further comprises:
performing, based at least in part on the comparing, an error control operation on the data read from the plurality of rows to correct single-bit errors and generate second data; and
writing the second data to the plurality of rows.

10. A memory device, comprising:
one or more memory arrays comprising a plurality of rows; and
one or more processors coupled with the one or more memory arrays and configured to cause the memory device to:
initiate a scrub operation on the plurality of rows;
determine whether to perform the initiated scrub operation using a first error control mode associated with correcting single-bit errors or using a second error control mode associated with correcting single-bit errors and detecting multiple-bit errors; and
perform the scrub operation based at least in part on determining to perform the scrub operation using the second error control mode, wherein to perform the scrub operation the one or more processors are configured to cause the memory device to:
read data and a first quantity of bits of error control information from each of the plurality of rows;
read a second quantity of bits of the error control information from a partition storing the error control information; and
compare bits of second error control information associated with data stored in each row with the first quantity of bits and the second quantity of bits of the error control information for the row to correct single-bit errors and detect multiple-bit errors in the data of each row.

11. The memory device of claim 10, wherein:
the first quantity of bits of the error control information is associated with correcting single-bit errors; and
a combination of the first quantity of bits of the error control information and the second quantity of bits of the error control information is associated with detecting multiple-bit errors.

12. The memory device of claim 10, further comprising:
a mode register coupled with the one or more processors wherein the one or more processors are further configured to cause the memory device to:
read the mode register indicating the second quantity of bits, wherein reading the second quantity of bits of the error control information is based at least the mode register indicating the second quantity of bits.

13. The memory device of claim 10, further comprising:
the partition coupled with the one or more processors and configured to store the error control information, wherein the one or more processors are further configured to cause the memory device to:
detect one or more multiple-bit errors in the data stored in the plurality of rows based at least in part on the comparing; and
store indications of the one or more detected multiple-bit errors in the partition storing the error control information.

14. The memory device of claim 10, further comprising:
the partition coupled with the one or more processors and configured to store the error control information, wherein the one or more processors are further configured to cause the memory device to:
receive a command to write first data to the memory device;
determine whether to write the first data using the first error control mode or using the second error control mode;
write the first data and a third quantity of bits of the error control information to a first row of the plurality of rows based at least in part on receiving the command; and
write a fourth quantity of bits of the error control information to the partition storing the error control information based at least in part on determining to write the first data using the second error control mode, wherein determining to perform the scrub operation using the second error control mode is based at least in part on writing the fourth quantity of bits.

15. The memory device of claim 14, further comprising:
a mode register coupled with the one or more processors, wherein the one or more processors are further configured to cause the memory device to:
write the mode register to indicate the second error control mode based at least in part on determining to write the first data using the second error control mode, wherein determining to perform the scrub operation using the second error control mode is based at least in part on the mode register indicating the second error control mode.

16. The memory device of claim 10, further comprising:
a mode register coupled with the one or more processors, wherein to determine whether to perform the scrub operation using the first error control mode or using the second error control mode, the one or more processors are further configured to cause the memory device to:
read the mode register indicating the second error control mode.

17. The memory device of claim 10, further comprising:
a plurality of second rows coupled with the one or more processors, wherein the one or more processors are further configured to cause the memory device to:
initiate a second scrub operation on the plurality of second rows;
determine whether to perform the initiated second scrub operation using the first error control mode or using the second error control mode; and
perform the second scrub operation based at least in part on determining to perform the second scrub operation using the second error control mode, wherein performing the second scrub operation comprises comparing second data stored in each row of the plurality of second rows with third error control information to correct single-bit errors in the second data of each row of the plurality of second rows.

18. The memory device of claim 10, wherein to perform the scrub operation the one or more processors are further configured to cause the memory device to:
perform, based at least in part on the comparing, an error control operation on the data read from the plurality of rows to correct single-bit errors and generate second data; and
write the second data to the plurality of rows.

19. A non-transitory computer-readable medium storing code comprising instructions which, when executed by one or more processors of an electronic device, cause the electronic device to:
initiate, at a memory device, a scrub operation on a plurality of rows of the memory device;
determine whether to perform the initiated scrub operation using a first error control mode associated with correcting single-bit errors or using a second error control mode associated with correcting single-bit errors and detecting multiple-bit errors; and
perform the scrub operation based at least in part on determining to perform the scrub operation using the second error control mode, wherein performing the scrub operation comprises:
reading data and a first quantity of bits of error control information from each of the plurality of rows;
reading a second quantity of bits of the error control information from a partition of the memory device storing the error control information; and
comparing bits of second error control information associated with data stored in each row with the first quantity of bits and the second quantity of bits of the error control information for the row to correct single-bit errors and detect multiple-bit errors in the data of each row.

20. The non-transitory computer-readable medium of claim 19, wherein:
the first quantity of bits of the error control information is associated with correcting single-bit errors; and
a combination of the first quantity of bits of the error control information and the second quantity of bits of the error control information is associated with detecting multiple-bit errors.

21. The non-transitory computer-readable medium of claim 19, wherein the instructions, when executed by the one or more processors of the electronic device, cause the electronic device to:
read a mode register indicating the second quantity of bits, wherein reading the second quantity of bits of the error control information is based at least the mode register indicating the second quantity of bits.

22. The non-transitory computer-readable medium of claim 19, wherein the instructions, when executed by the one or more processors of the electronic device, cause the electronic device to:
    detect one or more multiple-bit errors in the data stored in the plurality of rows based at least in part on the comparing; and
    store indications of the one or more detected multiple-bit errors in the partition of the memory device storing the error control information.

\* \* \* \* \*